United States Patent
Boon Yew et al.

(10) Patent No.: US 9,040,335 B2
(45) Date of Patent: May 26, 2015

(54) SIDE VENTED PRESSURE SENSOR DEVICE

(71) Applicants: Low Boon Yew, Petaling Jaya (MY);
Chee Seng Foong, Sg. Buloh (MY);
Teck Beng Lau, Petaling Jaya (MY)

(72) Inventors: Low Boon Yew, Petaling Jaya (MY);
Chee Seng Foong, Sg. Buloh (MY);
Teck Beng Lau, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 67 days.

(21) Appl. No.: 14/029,783

(22) Filed: Sep. 17, 2013

(65) Prior Publication Data

US 2015/0076630 A1    Mar. 19, 2015

(51) Int. Cl.
| | |
|---|---|
| *H01L 21/00* | (2006.01) |
| *B81B 3/00* | (2006.01) |
| *B81B 7/00* | (2006.01) |
| *B81C 1/00* | (2006.01) |

(52) U.S. Cl.
CPC ............ *B81B 7/0038* (2013.01); *B81C 1/00285* (2013.01); *B81B 2201/0235* (2013.01); *B81B 2201/0264* (2013.01)

(58) Field of Classification Search
CPC ........................................ H01L 23/28

USPC ................. 257/254, 415–420, 704, 709–711, 257/E29.324; 438/50–53, 124–127

See application file for complete search history.

(56) References Cited

U.S. PATENT DOCUMENTS

| | | | |
|---|---|---|---|
| 5,719,069 A * | 2/1998 | Sparks | ............................ 438/50 |
| 6,379,988 B1 | 4/2002 | Peterson | |
| 7,781,852 B1 | 8/2010 | Faheem | |
| 8,116,102 B2 * | 2/2012 | Wong et al. | ................... 361/813 |
| 8,169,041 B2 * | 5/2012 | Pahl et al. | ...................... 257/416 |
| 8,324,728 B2 * | 12/2012 | Tabrizi | ........................... 257/728 |
| 8,359,927 B2 | 1/2013 | Hooper | |
| 8,378,435 B2 | 2/2013 | Lo | |
| 2009/0134481 A1 | 5/2009 | Sengupta | |
| 2012/0139067 A1 | 6/2012 | Lo | |
| 2012/0306031 A1 | 12/2012 | Lo | |

* cited by examiner

*Primary Examiner* — Calvin Lee
(74) *Attorney, Agent, or Firm* — Charles Bergere

(57) ABSTRACT

A semiconductor sensor device has a pressure sensing die and at least one other die mounted on a substrate, and electrical interconnections that interconnect the pressure sensing die and the at least one other die. An active region of the pressure sensing die is covered with a pressure sensitive gel material, and a cap having a cavity is mounted over the pressure sensing die such that the pressure sensing die is positioned within the cavity. The cap has a side vent hole that exposes the gel covered active region of the pressure sensing die to ambient atmospheric pressure outside the sensor device. Molding compound on an upper surface of the substrate encapsulates the at least one other die and at least a portion of the cap.

14 Claims, 6 Drawing Sheets

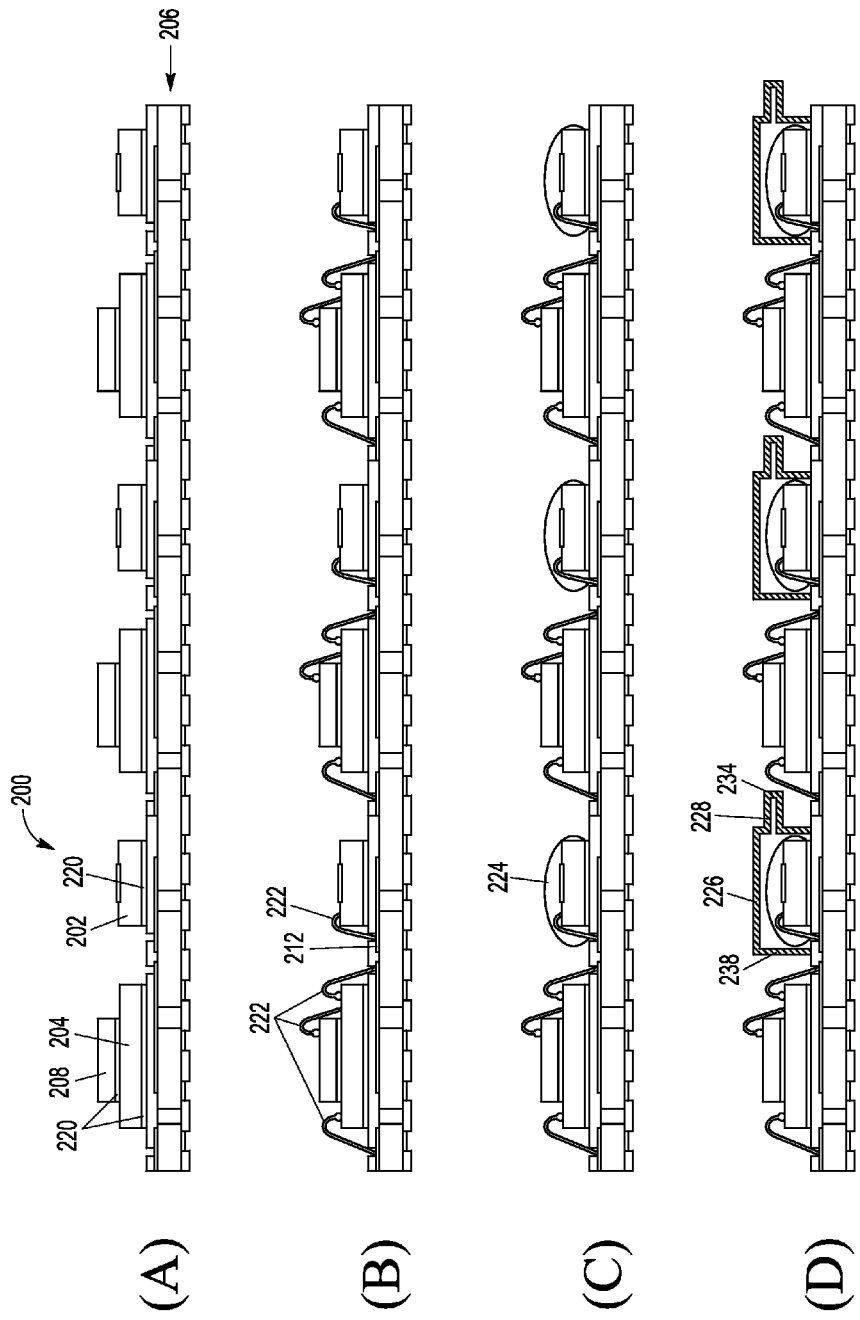

SIDE VENTED PRESSURE SENSOR DEVICE

BACKGROUND OF THE INVENTION

The present invention relates generally to semiconductor sensor devices, and, more particularly, to a pressure sensor device having a side vent.

Semiconductor sensor devices, such as pressure sensors, are well known. Such devices use semiconductor pressure sensor dies to sense the ambient atmospheric pressure. These dies are susceptible to mechanical damage during packaging and environmental damage when in use, and thus they must be carefully packaged. Further, pressure sensor dies, such as piezo-resistive transducers (PRTs) and parameterized layout cells (P-cells), do not allow full encapsulation because that would impede their functionality.

FIG. 1(A) shows an cross-sectional side view of a conventional packaged semiconductor sensor device 100 having a metal lid 104. FIG. 1(B) shows a perspective top view of the sensor device 100 partially assembled, and FIG. 1(C) shows a perspective top view of the lid 104.

As shown in FIG. 1, a pressure sensor die (P-cell) 106, an acceleration-sensing die (G-cell) 108, and a micro-control unit die (MCU) 110 are mounted on a lead frame flag 112, electrically connected to lead frame leads 118 with bond wires (not shown), and covered with a pressure sensitive gel material 114, which enables the pressure of the ambient atmosphere to reach the pressure sensitive active region on the top side of the P-cell 106, while protecting all of the dies 106, 108, 110 and the bond wires from mechanical damage during packaging and environmental damage (e.g., contamination and/or corrosion) when in use. The entire die/substrate assembly is encased in a mold compound 102 and covered with the lid 104, which has a vent hole 116 that exposes the gel-covered P-cell 106 to ambient atmospheric pressure outside the sensor device 100.

One problem with the sensor device 100 is the high manufacturing cost due to the use of a pre-molded lead frame, the metal lid 104, and the large volume of the pressure sensitive gel material 114. Accordingly, it would be advantageous to have a more economical way to package dies in semiconductor sensor devices.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 1:
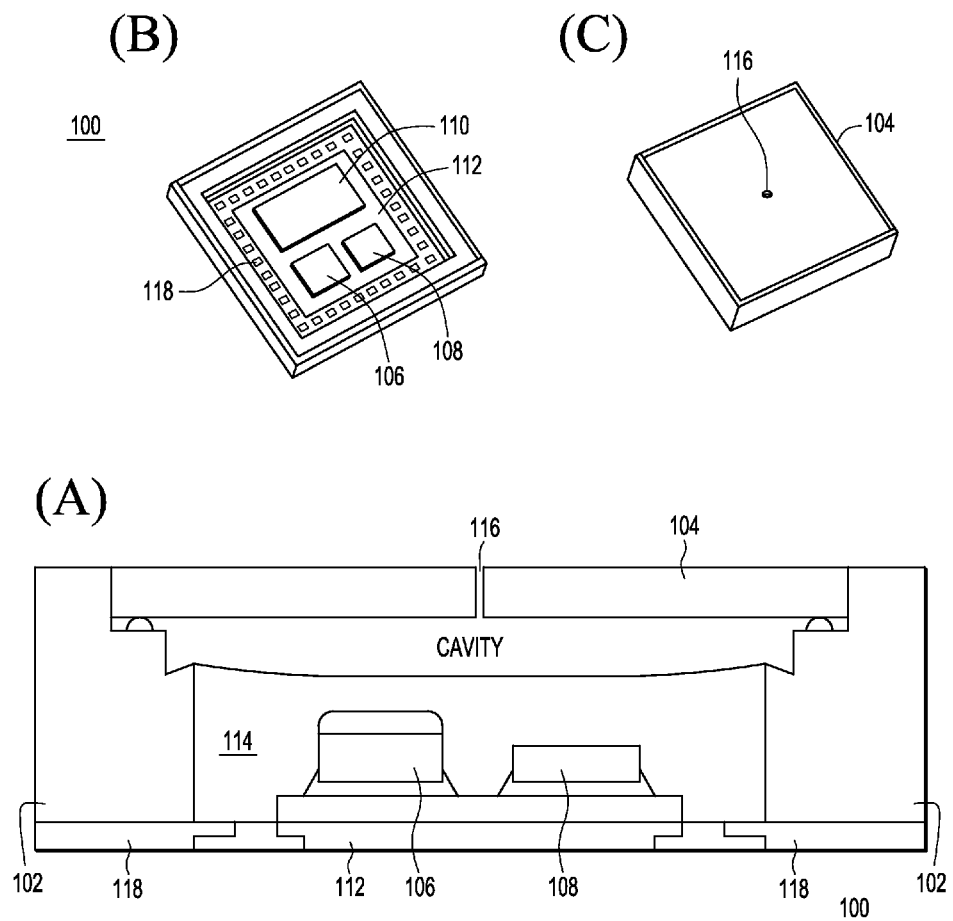
FIG. 1 shows a conventional packaged semiconductor sensor device having a metal lid.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

One embodiment of the present invention is a semiconductor sensor device comprising (i) a substrate, (ii) a pressure sensing die and at least one other die mounted on the substrate, (iii) electrical interconnections between the pressure sensing die and the at least one other die, (iv) pressure sensitive gel material covering an active region of the pressure sensing die, (iv) a cap having a cavity formed therein mounted over the pressure sensing die, and (v) molding compound on an upper surface of the substrate encapsulating the at least one other die and at least a portion of the cap. The pressure sensing die is positioned within the cavity, and the cap has a side vent hole formed thereon that exposes the gel covered active region of the pressure sensing die to ambient atmospheric pressure outside the sensor device.

Another embodiment of the present invention is a method of assembling a semiconductor sensor device. A pressure sensing die and at least one other die are mounted on a substrate. The pressure sensing die and the at least one other die are electrically interconnected. An active region of the pressure sensing die is covered with pressure sensitive gel material. A cap having a cavity formed therein, and a side vent stack formed thereon, is mounted over the pressure sensing die such that the pressure sensing die is positioned within the cavity. The at least one other die and at least a portion of the cap are encapsulated with a molding compound on an upper surface of the substrate. Singulation is performed through the substrate and the molding compound such that at least a portion of the side vent stack is severed from the cap, thereby forming a vent opening in the cap that exposes the gel-covered active region of the pressure sensing die to ambient atmospheric pressure outside the sensor device.

Figure 2:
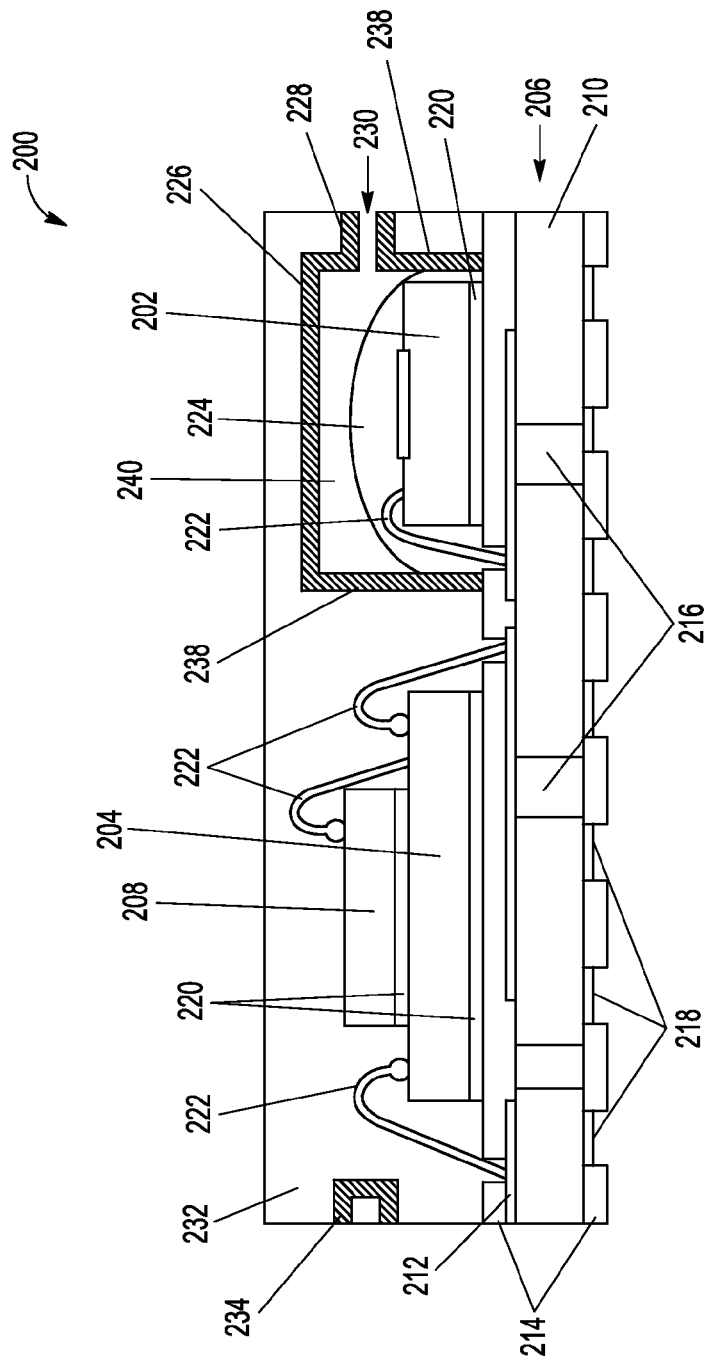
FIG. 2 shows a cross-sectional side view of a packaged semiconductor sensor device in accordance with one embodiment of the present invention.

FIG. 2 shows an cross-sectional side view of a packaged semiconductor sensor device 200 in accordance with an embodiment of the present invention. The exemplary configuration of the sensor device 200 forms a land grid array (LGA) type surface-mount package. Note that alternative embodiments are not limited to LGA packages, but can be implemented for other package types, such as (without limitation) ball grid array (BGA) type packages and other package types that can be assembled as a two-dimensional array of sensor devices on a single substrate.

The sensor device 200 includes a pressure sensor die 202 and a micro-control unit die (MCU) 204 mounted on (e.g., physically attached and electrically coupled to) a pre-formed substrate 206, and an acceleration-sensing die 208 mounted on the MCU 204. The pressure sensor die (aka P-cell) 202 is designed to sense ambient atmospheric pressure, while the acceleration-sensing die (aka G-cell) 208 is designed to sense gravity or acceleration in one, two, or all three axes, depending on the particular implementation. The MCU 204 controls, for example, the operations of and the processing of signals generated by the P-cell 202 and the G-cell 208. Note that, in some embodiments, the MCU 204 may implement both the functionality of an MCU and that of one or more other sensors, such as an acceleration-sensing G-cell, in which latter case, the G-cell 208 may be omitted.

The substrate 206 comprises a core dielectric material 210 with traces 212 and solder resist 214 formed thereon. Further, vias 216 are formed through the substrate 206. At the bottom of the substrate 206, pad openings in the solder resist 214 expose LGA contacts 218. The traces 212 and LGA contacts 218 may be formed using known photolithography techniques.

The P-cell 202 and the MCU 204 are die-bonded to the substrate 206, and the G-cell 208 is die-bonded to the MCU 204 using, for example, conventional, electrically insulating die-attach adhesive 220. Those skilled in the art will understand that suitable alternative die-bonding means, such as die-attach tape, may be used to attach some or all of these dies. The P-cell 202, the MCU 204, and the G-cell 208 are well-known components of semiconductor sensor devices and thus detailed descriptions thereof are not necessary for a complete understanding of the present invention.

The electrical interconnection between the P-cell 202 and the MCU 204 is provided via one or more shared trace(s) 212 of the substrate 206 by respective, associated bond wires 222 wire-bonded between (i) bond pads on the P-cell 202 and the MCU 204 and (ii) the trace(s) 212 using a suitable, known wire-bonding process and suitable, known wire-bonding equipment. Similarly, the electrical interconnection between the MCU 204 and the G-cell 208 is provided by wire-bonding between other bond pads on the MCU 204 and bond pads on the G-cell 208. Furthermore, the electrical interconnection between the MCU 204 and the outside world is provided via one or more trace(s) 212 of the substrate 206 by bond wires 222 wire-bonded between still other pads on the MCU 204 and the trace(s) 212. The bond wires 222 are formed from a conductive material such as aluminium, gold, or copper, and may be either coated or uncoated. Note that, in alternative designs, the G-cell 208 can be electrically connected to the MCU 204 using suitable flip-chip, solder-bump techniques instead of or in addition to wire-bonding.

A pressure sensitive gel material 224, such as a silicon-based gel, is deposited over the P-cell 202 and its associated bond wires 222. The pressure sensitive gel material 224 enables the pressure of the ambient atmosphere to reach the active region of the P-cell 202, while protecting the P-cell 202 and its associated bond wires 222 from (i) mechanical damage during packaging and (ii) environmental damage (e.g., contamination and/or corrosion) when in use. Examples of suitable pressure sensitive gel material 224 are available from Dow Corning Corporation of Midland, Mich. The gel material may be dispensed with a nozzle of a conventional dispensing machine, as is known in the art.

A cap 226 having sidewalls 238 with a cavity 240 formed therein is mounted over the gel-covered P-cell 202 such that gel-covered P-cell 202 resides in the cavity 240, thereby providing a protective cover for the P-cell 202. The cap 226 is formed of a durable and stiff material, such as plastic, teflon, metal, or other suitable material, so that the P-cell 202 is protected. The cap 226 may be secured on the substrate 206 using a suitable adhesive. The cap 226 is sized and shaped depending on the size and shape of the P-cell 202. Accordingly, depending on the implementation, the cap 226 may have any suitable shape, such as a box, cylindrical, or hemispherical shape.

The cap 226 has a vent stack 228, which may have any suitable shape, such as a tubular-shape having a circular, oval, square, triangular, or other shaped cross-section, with an opening or vent hole 230 formed therein. The vent hole 230 allows the ambient atmospheric pressure immediately outside the sensor device 200 to reach (i) the pressure sensitive gel material 224 and therethrough (ii) the active region of the P-cell 202. As will be described in further detail below, the vent hole 230 may be formed during a saw singulation process that is used to separate individual sensor devices in a two-dimensional array of the sensor devices from one another. The singulation process separates a distal end 234 of the vent stack 228 from the cap 226, and the distal end 234 may be left inside the molding compound of an adjacent sensor device during manufacturing. Thus, distal end 234 shown in FIG. 2 is actually associated with a sensor device (not shown) that was adjacent to the sensor device 200 before the two devices were separated using saw singulation, and not from the sensor device 200 itself.

The MCU 204, the G-cell 208, their associated bond wires 222, and the cap 226 are encapsulated within a suitable mold compound 232. The mold compound 232 may be a plastic, an epoxy, a silica-filled resin, a ceramic, a halide-free material, the like, or combinations thereof, as is known in the art.

The sensor device 200 can be manufactured with less cost than comparable prior-art sensor devices, like those based on the conventional design of the sensor device 100 of FIG. 1, because the sensor device 200 can be manufactured with fewer steps. For example, conventional sensor devices such as the sensor device 100 require a separate step, such as drilling, to form the vent hole 116 in the lid 104, and this hole-forming process may be performed before or after the lid 104 is attached to the sensor device 100. As described below, the vent hole 230 of the sensor device 200 may be formed during the saw singulation process, which separates sensor devices in a two-dimensional array from one another. Thus, together, the vent hole 230 is formed and the sensor devices are separated in a single step.

As another example, conventional sensor devices such as the sensor device 100 may require additional steps to prevent the molding compound and other debris coming into contact with the P-cell and pressure sensitive gel material during manufacturing. These additional steps may include separate steps to (i) protect the P-cell during application of the molding compound or (ii) die-bond the P-cell to the lead frame after the molding compound has been applied. In contrast, the P-cell 202 of the sensor device 200 may be die-bonded to the substrate 206 in a single stage along with the die-bonding of the MCU 204 and the G-cell 208. Then, during application of the molding compound, the cap 226 of the sensor device 200 completely encloses the P-cell 202 without any openings, thereby preventing the molding compound and debris from entering the cap 226. It is not until the saw singulation process (i.e., after the molding compound is applied) that the vent hole 230 of the sensor device 200 is formed.

As yet another example, conventional sensor devices such as the sensor device 100 may require the molding compound to be applied over two or more steps. For instance, the sensor device 100 requires molding compound to be applied separately to the lead frame. As illustrated below, the sensor device 200 may be assembled by applying the molding compound in a single step.

The vent hole 230 of the sensor device 200 may also be less susceptible to clogging than the vent hole of comparable sensor devices, like those based on the conventional design of the sensor device 100 of FIG. 1, because of the manner in which the vent hole 230 is formed and the location of the vent hole 230. In some prior-art sensor devices, the vent hole is formed, for example, by drilling the vent hole, after the lid or cap is placed over the P-cell. Forming the vent hole after the lid or cap is in place may result in debris from the drilling process entering the lid or cap. Further, by forming the vent hole 230 on the side of the sensor device 200, as opposed to on top of the device, the vent hole 230 may be less susceptible to being clogged during use by debris due to gravity or other forces, depending on the orientation of the sensor device. Note that, according to alternative embodiments, the vent stack 228 may extend from the sidewall 238 at an angle other than 90 degrees. For example, vent stack 228 may extend away from cap 226 at a downward angle toward the substrate 206.

FIGS. 3(A)-3(G) show cross-sectional side views that illustrate steps of an exemplary method of manufacturing multiple instances of the sensor device 200 of FIG. 2.

Figure 3:
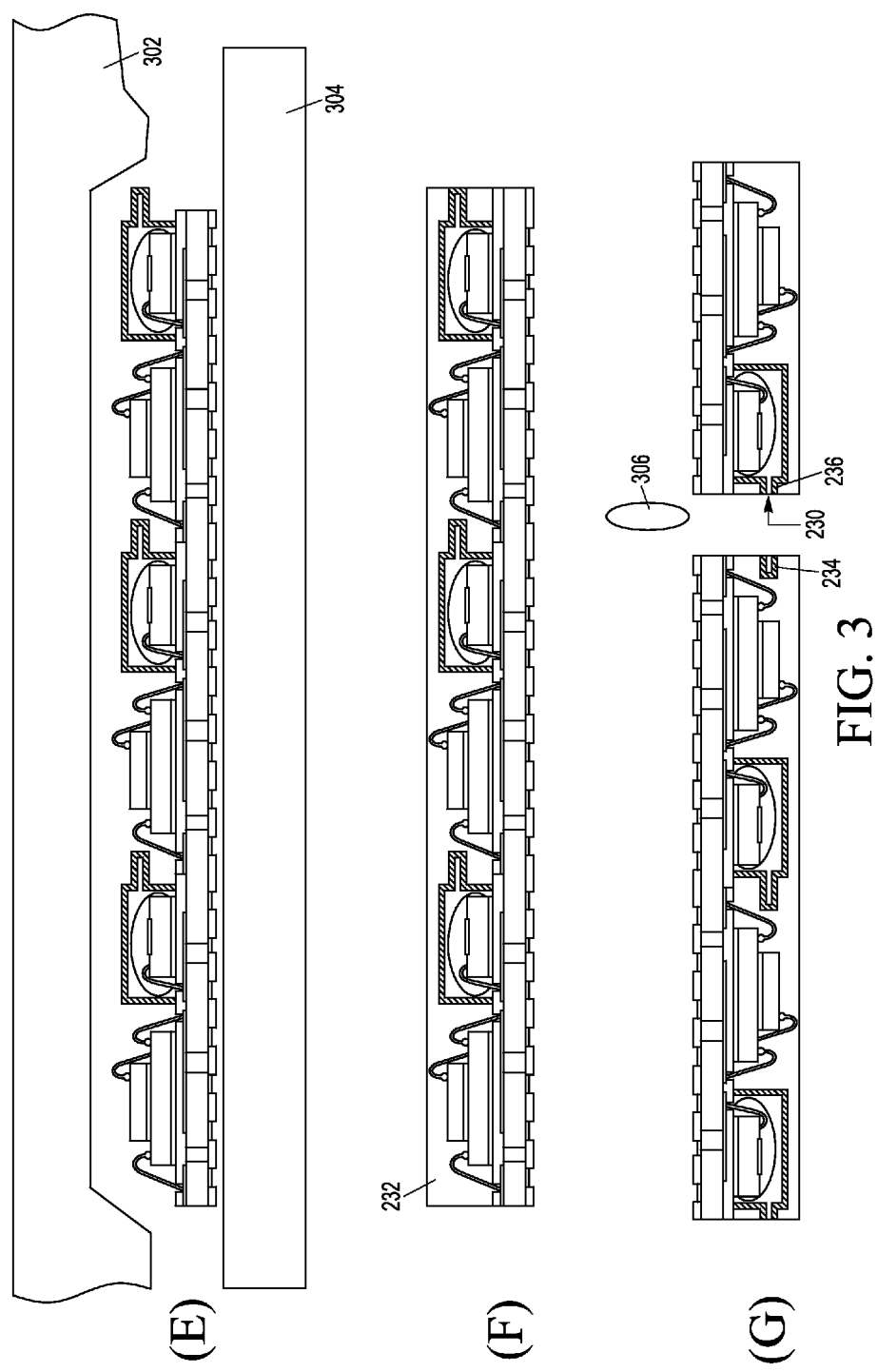
FIG. 3 shows cross-sectional side views that illustrate steps of an exemplary method of assembling multiple instances of the sensor device of FIG. 2.

FIG. 3(A) illustrates the step of conventional pick-and-place machinery (not shown) having attached multiple instances of the P-cell 202, the MCU 204, and the G-cell 208 to the substrate 206 for a one- or two-dimensional array of sensor devices. The MCU dies are attached to respective locations on the substrate 206 using the die-attach adhesive 220 such as a suitable die-bonding epoxy. The die-attach adhesive 220 is dispensed on a top surface of the substrate 206 using a known dispensing device (not shown), and the pick-and-place machinery places the MCU dies on the die-attach adhesive to attach the MCU dies to corresponding locations on the substrate 206. The die-attach adhesive may subsequently be cured in an oven or via light waves to harden the die-attach adhesive. The P-cells 202 and the G-cells 208 are attached in a similar manner using pick-and-place machinery and die-attach adhesive.

FIG. 3(B) illustrates the step of wire-bonding the bond wires 222 to electrically connect (i) the P-cells 202 to the corresponding trace(s) 212 on the substrate 206, (ii) the MCU dies 204 to the corresponding trace(s) 212 on the substrate 206, and (iii) the G-cells 208 to the corresponding MCU dies 204.

Another way of electrically connecting a semiconductor die is through flip-chip bumps (not shown) attached to an underside of the semiconductor die. The flip-chip bumps may include solder bumps, gold balls, molded studs, or combinations thereof. The bumps may be formed or placed on the semiconductor die using known techniques such as evaporation, electroplating, printing, jetting, stud bumping, and direct placement. The semiconductor die is flipped, and the bumps are aligned with corresponding contact pads (not shown) of the structure (e.g., the substrate or another die) to which the die is mounted.

FIG. 3(C) illustrates the step of dispensing the gel material 224 onto and around the P-cells 202. The gel material 224 may be dispensed with a nozzle of a conventional dispensing machine (not shown), as is known in the art.

FIG. 3(D) illustrates the step of placing a respective cap 226 over each gel-coated P-cell. As shown, the distal end 234 of each vent stack 228 is closed. Further, each vent stack 228, with the exception of the vent stack 228 on the right-most cap 226, extends partially above the substrate of an adjacent sensor device. The caps may be attached to the substrate 206 using a suitable cap-attach adhesive (not shown) or may simply be placed into position and secured later using the molding compound 232 as described below. In the event that cap-attach adhesive is used, the cap-attach adhesive may be dispensed on a top surface of the substrate 206 using a known dispensing device (not shown), and the side walls 238 of each cap 226 are placed on the lid-attach adhesive to attach the side walls to the substrate 206. The lid-attach adhesive may be subsequently cured in an oven.

FIG. 3(E) illustrates the step of positioning a top mold 302 over, and a bottom mold 304 under, the sensor devices 200 for application of the molding compound 232.

FIG. 3(F) illustrates the step of applying the molding compound 232 the sensor devices 200. As shown, the molding compound 232 completely covers the caps 226, the MCUs 204, the G-cells 208, and the bonding wires 222 that electrically connect (i) the MCUs 204 to the corresponding trace(s) 212 on the substrate 206 and (ii) the G-cells 208 to the corresponding MCUs 204. One way of applying the molding compound is using a nozzle of a conventional dispensing machine, as is known in the art. Since the caps 226 completely cover their respective P-cells without any openings formed therein, the caps 226 prevent the molding compound and debris from reaching the P-cells during application of the molding compound.

The molding compound 232 is typically applied as a liquid polymer, which is then heated to form a solid by curing in a UV or ambient atmosphere, whereby an array of the semiconductor sensor devices 200 is formed on the substrate 206. The molding compound 232 can also be a solid that is heated to form a liquid for application and then cooled to form a solid mold. In alternative embodiments, other encapsulating processes may be used. Subsequently, an oven is used to cure the molding compound 232 to complete the cross linking of the polymer.

FIG. 3(G) illustrates the step of the individual semiconductor sensor devices 200 being separated from each other by a singulation process. Singulation processes are well known and may include cutting the substrate 206 with a saw blade 306 or a laser (not shown). When the molding compound is applied to the devices, the presence of the molding compound makes it difficult, if not impossible, from looking at the top of the devices, to distinguish where one sensor device ends and another sensor device begins. Therefore, the substrate 206 may be cut from the bottom side of the substrate 206, where the LGA grid patterns of the devices are visible.

As the singulation process separates the individual sensor devices, a cut is made through each vent stack 228 in each cap 226 such that each vent stack 228 is cut in two. As a result, the proximal end 236 of each vent stack 228 has a vent hole 230 formed therein, and the distal end 234 of each vent stack 228, with the exception of the vent stack in the right-most sensor device, remains lodged in the molding compound of the corresponding adjacent sensor device. The vent stack of the right-most sensor device remains lodged in excess molding compound that is separated by the singulation process and discarded. Note that, in some embodiments, the singulation process may completely remove the vent stack 228 of a cap 226, thereby forming a hole in the sidewall 238 of the cap 226. Further, the device 200 may be designed such that, when the distal end 234 of the vent stack 228 is separated from the cap 226, no portion of the distal end 234 remains in the adjacent device.

Figure 4:
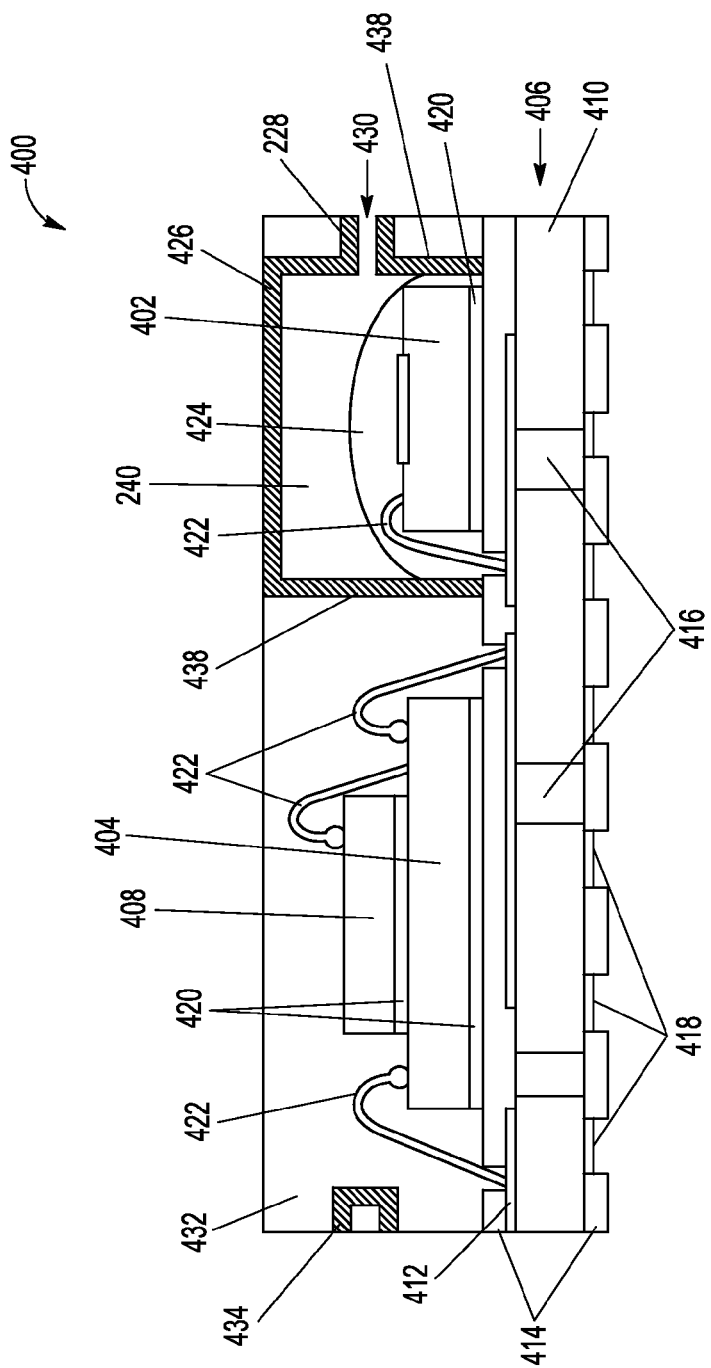
FIG. 4 shows a cross-sectional side view of a packaged semiconductor sensor device in accordance with another embodiment of the present invention.

FIG. 4 shows an cross-sectional side view of a packaged semiconductor sensor device 400 in accordance with another embodiment of the present invention. The sensor device 400 is similar to the sensor device 200 in FIG. 2 with analogous elements having similar labels, with the exception that the molding compound 432 does not cover the top of the cap 426. The sensor device 400 is assembled in a manner similar to that described above in relation to FIGS. 3(A)-(G). However, the steps of placing the caps and positioning the top and bottom molds as shown in FIGS. 3(D) and 3(E) may be performed as shown in FIG. 5.

Figure 5:
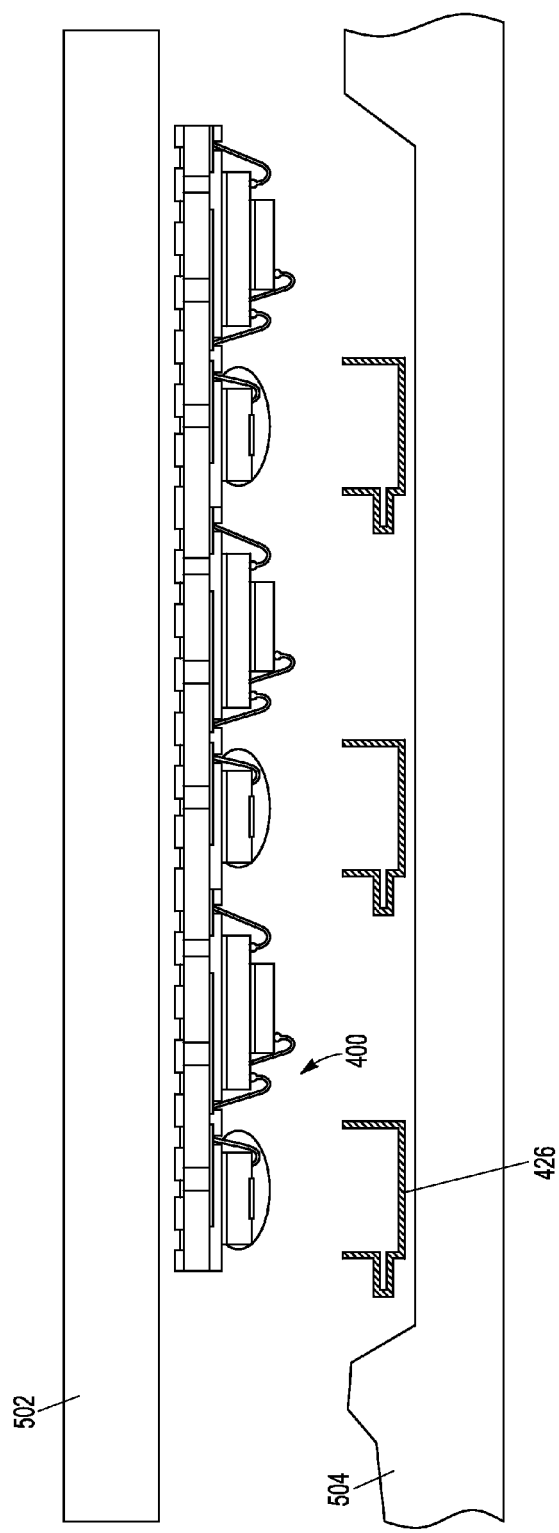
FIG. 5 illustrates an exemplary step of positioning top mold, bottom mold, and caps for assembling multiple instances of the sensor device of FIG. 4.

FIG. 5 illustrates the step of positioning the top mold 502, the bottom mold 504, and the caps 426 for application of the molding compound 432. As shown, the caps 426 are placed upside down on the bottom mold 504. Then, the substrate 406 is turned upside down and lowered such that the gel-coated P-cells 402 are positioned within the caps 426. Note that the caps 426 may be secured to the substrate 406 using adhesive as described above. The top mold 502 is positioned on top of the bottom side of the substrate 406. When the top and bottom molds 502 and 504 are filled with the molding compound, the molding compound does not cover the tops of the caps 426 due to the contact between the tops of caps 426 and the bottom mold 504. As a result, the tops of the caps 426 of the sensor devices 400 are exposed (i.e., not covered with molding compound) as shown in FIG. 4.

Although FIGS. 2 and 4 show the sensor devices 200 and 400 each having a P-cell and a G-cell, those skilled in the art will understand that, in alternative embodiments, the G-cell and its corresponding bond wires may be omitted.

Further, although FIGS. 2 and 4 show the sensor devices 200 and 400 each having only the P-cell 202/402 positioned within the cap 226/426), those skilled in the art will understand that, in alternative embodiments, the one or both of the G-cell 208/408 and the MCU 204/404 may also be positioned within the cap 226/426. Accordingly, the cap 226/426 may be sized and shaped to house the G-cell 208/408 and/or the MCU 204/404 in addition to the P-cell 202/402.

Although FIGS. 2 and 4 show embodiments in which the G-cell 208/408 is mounted on the MCU 204/404 with the electrical interconnection provided by wire-bonding, those skilled in the art will understand that the electrical interconnection between such dies can, alternatively or additionally, be provided by appropriate flip-chip assembly techniques. According to these techniques, two semiconductor dies are electrically interconnected through flip-chip bumps attached to one of the semiconductor dies. The flip-chip bumps may include solder bumps, gold balls, molded studs, or combinations thereof. The bumps may be formed or placed on a semiconductor die using known techniques such as evaporation, electroplating, printing, jetting, stud bumping, and direct placement. The semiconductor die is flipped, and the bumps are aligned with corresponding contact pads of the other die.

It will be understood that, as used herein, the term "electrical interconnection" refers to a connection that may be made using one or more of bond wires, flip-chip bumps, traces, and other conductors used to electrically interconnect one die to another die or a substrate.

Although sensor devices of the present invention were described as being assembled in an array of sensor devices, embodiments of the present invention are not so limited. According to alternative embodiments, sensor devices of the present invention may be assembled individually. In such embodiments, a vent hole such as the vent hole 230 may be formed therein using a sawing process. Note, however, that the sawing process would not be used to separate sensor devices from one another, and each individual sensor device would not contain a distal end (e.g., 234) from an adjacent device that was severed during the sawing process.

By now it should be appreciated that there has been provided an improved packaged semiconductor sensor device and a method of forming the improved packaged semiconductor sensor device. Circuit details are not disclosed because knowledge thereof is not required for a complete understanding of the invention.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the present invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the term "mounted on" covers situations in which a first element is mounted directly on a second element with no other intervening elements, as well as situations in which there are two or more intervening elements between the first element and the second element.

Although the present invention is described herein with reference to specific embodiments, various modifications and changes can be made without departing from the scope of the present invention as set forth in the claims below. For example, the number and positions of vias in the substrate 206 and the configurations of traces on the substrate 206 may vary. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that are enabled by this specification and correspond to statutory subject matter. Non-enabled embodiments and embodiments that correspond to non-statutory subject matter are explicitly disclaimed even if they fall within the scope of the claims.

The invention claimed is:

1. A method of assembling a semiconductor sensor device, the method comprising:
    mounting a pressure sensing die and at least one other die on a substrate;
    electrically interconnecting the pressure sensing die and the at least one other die;
    covering an active region of the pressure sensing die with pressure sensitive gel material;
    mounting a cap having a cavity formed therein over the pressure sensing die, wherein:
        the pressure sensing die is positioned within the cavity; and
        the cap has a side vent stack formed thereon;
    encapsulating the at least one other die and at least a portion of the cap with a molding compound on an upper surface of the substrate; and
    singulating through the substrate and the molding compound such that at least a portion of the side vent stack is severed from the cap, thereby forming a vent opening in the cap that exposes the gel-covered active region of the pressure sensing die to ambient atmospheric pressure outside the sensor device.

2. The method of claim 1, wherein the encapsulating step comprises encapsulating all of the cap with the molding compound.

3. The method of claim 1, wherein the encapsulating step comprises encapsulating all but a top of the cap with the molding compound.

4. The method of claim 1, wherein:
    the at least one other die comprises a micro-control unit (MCU) and an acceleration sensor die;
    mounting the at least one other die on the substrate comprises mounting the MCU on the substrate and mounting the acceleration-sensing die on the MCU; and
    the method further comprises electrically connecting the acceleration-sensing die to the MCU.

5. The method of claim 1, further comprising assembling an other sensor device on the substrate adjacent to the sensor device, wherein performing the singulation through the substrate and the molding compound separates the sensor device from the other sensor device.

6. The method of claim 5, wherein performing the singulation through the substrate and the molding compound leaves a portion of the side vent stack in molding compound of the other sensor device.

7. A semiconductor sensor device comprising:
    a substrate;
    a pressure sensing die and at least one other die mounted on a top side of the substrate;
    electrical interconnections between the pressure sensing die and the at least one other die;
    pressure sensitive gel material covering an active region of the pressure sensing die;
    a cap having a cavity formed therein mounted over the pressure sensing die, wherein:
        the pressure sensing die is positioned within the cavity such that the pressure sensing die is enclosed inside the cap and the substrate; and
        the cap has a side vent hole formed thereon that exposes the gel covered active region of the pressure sensing die to ambient atmospheric pressure outside the sensor device, wherein the side vent hole is located between a top side of the cap and the top side of the substrate and extends in a plane parallel to said top sides; and
    molding compound on an upper surface of the substrate encapsulating the at least one other die and at least a portion of the cap.

8. The sensor device of claim 7, further comprising a vent stack formed on a side of the cap, wherein the side vent hole is formed in the vent stack.

9. The sensor device of claim 7, further comprising at least a portion of a vent stack encapsulated in the molding compound, wherein the portion of the vent stack corresponds to a side vent hole of another sensor device that was separated from the sensor device during assembly by sawing through the vent stack of the other sensor device.

10. The sensor device of claim 7, wherein the sensor device implements one of (i) a land grid array (LGA) and (ii) a ball grid array (BGA) type surface-mount package.

11. The sensor device of claim 7, wherein the molding compound encapsulates all but the side vent hole of the cap.

12. The sensor device of claim 7, wherein the molding compound encapsulates all but the side vent hole and a top of the cap.

13. The sensor device of claim 7, wherein the at least one other die comprises a micro-control unit (MCU).

14. The sensor device of claim 13, further comprising an acceleration-sensing die mounted on the MCU, wherein the acceleration-sensing die is electrically connected to the MCU.

* * * * *